(12) United States Patent
Daginnus-Metzen

(10) Patent No.: US 11,581,207 B2
(45) Date of Patent: Feb. 14, 2023

(54) TRANSPORT SYSTEM

(71) Applicant: Infineon Technologies AG, Neubiberg (DE)

(72) Inventor: Michael Daginnus-Metzen, Lippstadt (DE)

(73) Assignee: Infineon Technologies AG, Neubiberg (DE)

( * ) Notice: Subject to any disclaimer, the term of this patent is extended or adjusted under 35 U.S.C. 154(b) by 272 days.

(21) Appl. No.: 16/891,421

(22) Filed: Jun. 3, 2020

(65) Prior Publication Data
US 2020/0388519 A1 Dec. 10, 2020

(30) Foreign Application Priority Data
Jun. 4, 2019 (EP) .................................. 19178237

(51) Int. Cl.
*H01L 21/673* (2006.01)
*B65G 1/04* (2006.01)

(52) U.S. Cl.
CPC .......... *H01L 21/67309* (2013.01); *B65G 1/04* (2013.01)

(58) Field of Classification Search
CPC ................ B65G 1/04; H01L 21/67309; H01L 21/67346; H01L 21/67359; H01L 21/67356; H01L 21/67383; H01L 21/67303; H01L 21/67386; H01L 21/6732; H01L 21/673; B65D 90/028; B65D 2519/00084; B65D 2519/00378; B65D 2519/00477; B65D 2519/00552
See application file for complete search history.

(56) References Cited

U.S. PATENT DOCUMENTS

| | | | |
|---|---|---|---|
| 2003/0128528 A1 | 7/2003 | Matthews | |
| 2006/0249080 A1* | 11/2006 | Zehavi | H01L 21/67303 118/725 |
| 2013/0341239 A1* | 12/2013 | Inoue | H01L 21/6732 206/711 |
| 2014/0367305 A1* | 12/2014 | Mizuo | B65D 19/44 206/585 |
| 2016/0104633 A1* | 4/2016 | Moore | H01L 21/67132 156/701 |
| 2017/0137200 A1 | 5/2017 | Hudson et al. | |

FOREIGN PATENT DOCUMENTS

| | | |
|---|---|---|
| CN | 101811607 A | 8/2010 |
| EP | 2439770 A2 | 4/2012 |
| EP | 2840599 A1 | 2/2015 |
| WO | 2014005333 A1 | 1/2014 |

* cited by examiner

*Primary Examiner* — Glenn F Myers
(74) *Attorney, Agent, or Firm* — Murphy, Bilak & Homiller, PLLC

(57) ABSTRACT

A transportation system for semiconductor module base plates includes a plurality of spacer elements. Each spacer element includes a distance holding element, a first pin on a first side of the distance holding element, and a second pin on a second side of the distance holding element. Each spacer element is configured to be arranged between two of a plurality of semiconductor module base plates. Each of the first pin and the second pin is configured to engage with a corresponding counterpart of one of the semiconductor module base plates when the corresponding spacer element is arranged between two of the semiconductor module base plates.

15 Claims, 4 Drawing Sheets

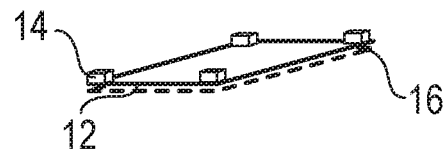
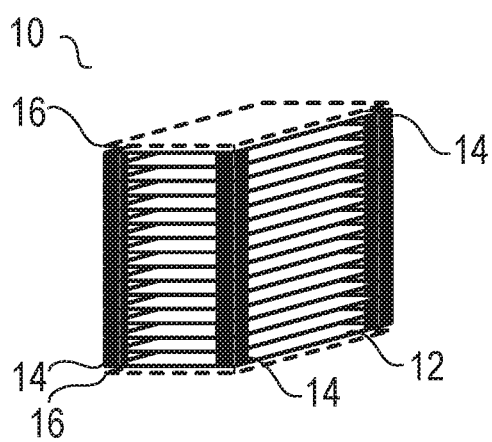
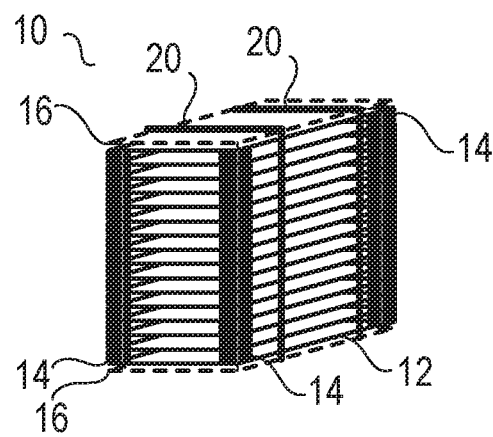
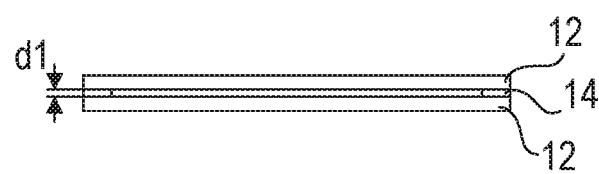

TRANSPORT SYSTEM

TECHNICAL HELD

The instant disclosure relates to a transport system, in particular to a transport system for base plates for semiconductor modules.

BACKGROUND

Power semiconductor module arrangements often include at least one semiconductor substrate arranged in a housing. A semiconductor arrangement including a plurality of controllable semiconductor elements (e.g., two IGBTs in a half-bridge configuration) is arranged on each of the at least one substrate. The at least one substrate may be arranged on a base plate. The base plate may form a bottom of the housing.

During production and assembly of power semiconductor module arrangements, especially before mounting at least one semiconductor substrate on the base plates, usually a great number of base plates needs to be handled. A plurality of base plates may be produced and the finished bare base plates may then be packaged for shipping or for transporting them to the power semiconductor module assembly line, for example. Even bare base plates that are not yet finished, e.g., base plates that require one or more additional production steps such as coating, for example, may be packaged for shipping or for transporting them to another production line. Even further, fitted base plates with one or more elements such as, e.g., substrates, mounted thereon may be packaged for shipping or for transporting them to a further production or placement line.

There is a need for a transportation system for finished or unfinished, bare or fitted power semiconductor module base plates that allows to securely transport a plurality of base plates in a space-saving way and without damages.

SUMMARY

A transportation system for semiconductor module base plates includes a plurality of spacer elements, wherein each of the plurality of spacer elements includes a distance holding element, a first pin on a first side of the distance holding element, and a second pin on a second side of the distance holding element, and wherein each of the plurality of spacer elements is configured to be arranged between two of a plurality of semiconductor module base plates. Each of the first pin and second pin is configured to engage with a corresponding counterpart of one of the base plates when the corresponding spacer element is arranged between two semiconductor module base plates.

Another transportation system for semiconductor module base plates includes at least two elongated edge elements, wherein each of the at least two edge elements includes a plurality of compartments that are separated from each other by partition walls, each compartment is configured to receive the corner of one semiconductor module base plate such that, when a plurality of base plates is inserted into the edge elements, a corner of each base plate is separated from the corresponding corner of a neighboring base plate by a partition wall, and two of the at least two edge elements are arranged at transversely opposite corners of the base plates.

A method includes forming a stack by stacking a plurality of semiconductor module base plates and a plurality of spacer elements on top of each other, wherein the semiconductor module base plates and the spacer elements form a plurality of layers that owe stacked alternatingly within the stack. Each of the plurality of base plates includes a plurality of counterparts, and each of the spacer elements includes a distance holding element, a first pin on a first side of the distance holding element and a second pin on a second side of the distance holding element. Forming the stack includes inserting each first pin of the plurality of spacer elements into one of the counterparts of a first base plate, and inserting the second pin of the respective spacer element into one of the counterparts of a neighboring base plate The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 9A to 9D schematically illustrate a method for forming a stack of semiconductor module base plates according to one example.

FIG. 10 schematically illustrates a side view of two semiconductor module base plates with a spacer element arranged therebetween according to one example.

DETAILED DESCRIPTION

Figure 1A:
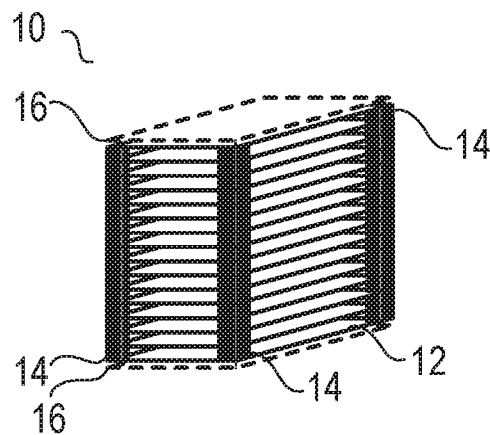
FIGS. 1A and 1B show respective three-dimensional views of a stack of semiconductor module base plates.

In the following detailed description, reference is made to the accompanying drawings. The drawings show specific examples in which the invention may be practiced. It is to be understood that the features and principles described with respect to the various examples may be combined with each other, unless specifically noted otherwise. In the description, as well as in the claims, designations of certain elements as "first element", "second element", "third element" etc. are not to be understood as enumerative. Instead, such designations serve solely to address different "elements". That is, e.g., the existence of a "third element" does not necessarily require the existence of a "first element" and a "second element". A semiconductor body as described herein may be made from (doped) semiconductor material and may be a semiconductor chip or be included in a semiconductor chip. A semiconductor body has electrically connecting pads and includes at least one semiconductor element with electrodes.

Power semiconductor module arrangements often include a housing and a semiconductor substrate that is mounted on a base plate and inside the housing. The base plate may be arranged inside the housing or may form a bottom of the housing, for example. The at least one semiconductor substrate that is mounted on the base plate may include a dielectric insulation layer, a (structured) first metallization layer attached to the dielectric insulation layer, and a second (structured) metallization layer attached to the dielectric insulation layer. The dielectric insulation layer is disposed between the first and second metallization layers.

Each of the first and second metallization layers of the semiconductor substrate may consist of or include one of the following materials: copper; a copper alloy; aluminum; an aluminum alloy; any other metal or alloy that remains solid during the operation of the power semiconductor module arrangement. The semiconductor substrate may be a ceramic substrate, that is, a substrate in which the dielectric insulation layer is a ceramic, e.g., a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer may consist of or include one of the following materials: $Al_2O_3$, MN, SiC, BeO or $Si_3N_4$. For instance, the substrate may, e.g., be a Direct Copper Bonding (DCB) substrate, a Direct Aluminum Bonding (DAB) substrate, or an Active Metal Brazing (AMB) substrate. Further, the substrate may be an insulated Metal Substrate (IMS). An Insulated Metal Substrate generally comprises a dielectric insulation layer comprising (filled) materials such as epoxy resin or polyimide, for example. The material of the dielectric insulation layer may be filled with ceramic particles, for example. Such particles may comprise, e.g., $Si_2O$, $Al_2O_3$, MN, or BrN and may have a diameter of between about 1 μm and about 50 μm. The substrate may also be a conventional printed circuit board (PCB) having a non-ceramic dielectric insulation layer. For instance, a non-ceramic dielectric insulation layer may consist of or include a cured resin.

One or more semiconductor substrates may be mounted on a single base plate. One or more semiconductor bodies may be arranged on each of the at least one semiconductor substrate. Each of the semiconductor bodies arranged on the at least one semiconductor substrate may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element. The one or more semiconductor bodies may form a semiconductor arrangement on the semiconductor substrate.

Before mounting at least one semiconductor substrate to a base plate during an assembly process, the base plate needs to be produced and to be transported to an assembly line. Usually, the base plates are produced at a separate production plant and need to be shipped to the assembly line. Also unfinished bare base plates may be shipped for further treatment. Further, fitted base plates with one or more elements mounted thereon may be shipped for further handling or assembly. For transporting the finished or unfinished unequipped (unassembled) or fitted (at least partly assembled) base plates to another assembly line or to a customer, usually a plurality of base plates is packed into a tray. Each base plate is usually wrapped into a separate one of a plurality of transportation bags. The tray with the individually packed base plates is then inserted into an even bigger transportation bag to prevent the base plates from falling out of the tray and prepare the tray for shipping. However, the trays with the plurality of base plates arranged therein are bulky and therefore difficult to insert into the bigger shipping bags. Further, the individual base plates are constantly in contact with the smaller transportation bags that are used to individually pack the base plates. Sometimes, the base plates are not even inserted into individual transportation bags. In such cases, a plurality of base plates is inserted into a bigger transportation bag with or without a tray. Sometimes, sheets of separating material are inserted between two neighboring base plates, sometimes such sheets are omitted. In such cases, the different base plates may grate against each other, with only thin layers of transportation bags in between them or without any other layers between them, which may result in abrasion of base plate material. Even further, trays with a plurality of base plates arranged therein are large, and therefore difficult to transport.

Figure 1B:
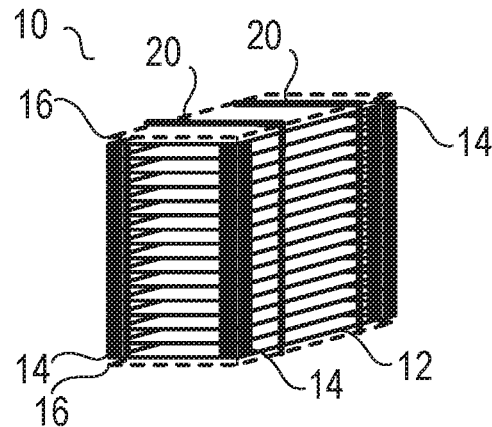

Now referring to FIGS. 1A and 1B, a transportation system for finished or unfinished bare, unequipped (unassembled) or at least partly fitted (assembled) semiconductor module base plates 12 is described that is smaller in size than the known trays, and which prevents the semiconductor module base plates 12 from constantly being in contact with each other, with the transportation bags, or with the tray, and from being damaged or abraded during transport.

As is schematically illustrated in FIG. 1A, a stack 10 is formed from a plurality of base plates 12 and a plurality of spacer elements 14. The base plates 12 and the spacer elements 14 are arranged alternatingly within the stack 10. That is, each base plate 12 is separated from a neighboring base plate 12 by at least one of a plurality of spacer elements 14. The topmost element as well as the lowermost element of the stack 10 may be a stack termination element 16, respectively, That is, if the stack termination elements 16, the plurality of base plates 12 and the plurality of spacer elements 14 are considered as individual layers of the stack 10, the two outermost layers of the stack 10 may be formed by stack termination elements 16.

As is schematically illustrated in FIG. 1B, the stack 10 with the plurality of base plates 12, the plurality of spacer elements 14, and the stack termination elements 16 may be bound together with at least one retaining element 20. In this way, the stack 10 may be prevented from falling apart. The stack termination elements 16, base plates 12 and spacer elements 14 may be held firmly together by the at least one retaining element 20, In FIG. 1B, two retaining elements 20 are exemplarily illustrated. In many cases, one or two retaining elements 20 may be sufficient in order to prevent the stack 10 from falling apart. The number of retaining elements 20 may depend on the size of the base plates 12 and the dimensions of the retaining elements 20, for example. Each retaining element 20 may comprise a belt, cord, string, packing tape, or ribbon, for example. The stack 10 formed by the base plates 12, stack termination elements 16, and spacer elements 14 and held together by the retaining elements 20 may be inserted into a transportation bag for shipping, for example (transportation bag not explicitly illustrated in FIGS. 1A-1B), According to one example, the retaining elements 20 are arranged in such a way that the forces that are applied by the retaining elements 20 are not transferred to the base plates 12. Preferably, any forces induced by the retaining elements 20 are solely transferred to the spacer elements 14. For example, a length of the retaining elements 20 may be chosen such that the force induced by the retaining elements 20 on the stack 10 and, in particular on the base plates 12, does not exceed a certain threshold.

Using retaining elements 20 to bind together the stack termination elements 16, base plates 12 and spacer elements 14, however, is only an example. As will be described further below, depending on the kind of spacer elements 14 that are used to form the stack 10, in some cases no retaining elements 20 may be necessary at all. The spacer elements 14 may comprise a material such as a plastic or a metallic material. These materials, however, are only examples. Any other suitable materials may be used for the spacer elements 14.

Figure 2:
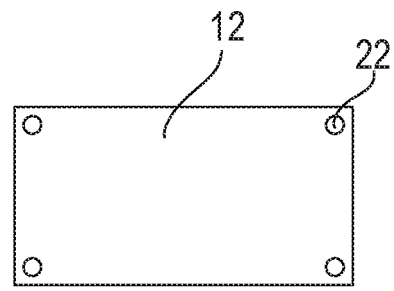
FIG. 2 schematically illustrates a top view of a semiconductor module base plate.
Figure 3A:
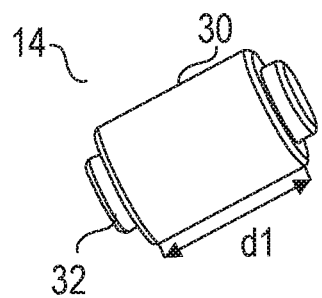
FIGS. 3A and 3B schematically illustrate respective three-dimensional views of exemplary spacer elements.
Figure 3B:
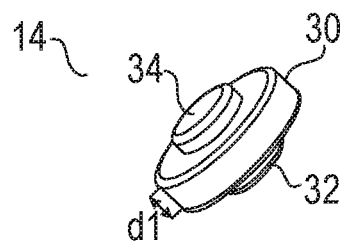

Now referring to FIG. 2, a semiconductor module base plate 12 according to one example is schematically illustrated in further detail. During transportation of the base plates 12, no semiconductor substrates or semiconductor bodies may yet be arranged on the base plate 12. That is, the base plate 12 is a bare, unequipped (unassembled) base plate 1 out any further elements mounted thereon. It is, however, also possible to ship or transport partly or fully fitted (assembled) base plates 12. That is, one or more elements such as, e.g., semiconductor substrates, may already be mounted to the base plates 12. Each base plate 12 may comprise at least one counterpart 22, each of the counterparts 22 being configured to receive a corresponding pin of one of the spacer elements 14. According to one example, each spacer element 14 each may comprise at least one pin 32, 34, as is illustrated in FIGS. 3A and 3B. Each of the counterparts 22 may comprise an indentation. Each of the pins 32, 34 may engage with (may be inserted into) one of the corresponding counterparts 22 of the base plate 12. In particular, a first pin 32 may be inserted into a first counterpart 22 of a first base plate 12, and a second pin 34 may be inserted into a second counterpart 22 of a neighboring second base plate 12. This may prevent the base plates 12 and spacer elements 14 from shifting with respect to each other. That is, each base plate 12 may be held in a certain position with respect to its neighboring spacer elements 14 as well as with respect to its neighboring base plates 12.

Referring to FIG. 3A, each spacer element 14 may comprise a distance holding element 30. The first pin 32 may be arranged on a first side of the distance holding element 30, and the second pin 34 may be arranged on at a second side of the distance holding element 30, opposite to the first side. The distance holding element 30 is configured to keep neighboring base plates 12 at a certain distance from each other. A distance d1 between the first pin 32 at the first side and the second pin 34 at the second side of the distance holding element 30 (d1=length of the distance holding element 30) may differ depending of the kind of base plates 12 that are to be transported, for example. For example, the distance d1 may depend on the size of the base plates 12 and/or on the material of the base plates 12. The distance d1 may further depend on whether the base plates 12 are bare or fitted. For example, if the base plates 12 are bare, the distance d1 between two neighboring base plates 12 may be smaller. If one or more elements are already mounted to the base plates 12, a greater distance d1 between two neighboring base plates 12 may be necessary to avoid the elements of one base plate 12 touching a neighboring base plate 12, for example.

Spacer elements 14 defining a distance d1 between two neighboring base plates 12 are further exemplarily illustrated in FIG. 10. For the sake of explanation, only two base plates 12 are exemplarily illustrated in FIG. 10, with spacer elements 14 arranged between the two base plates 12.

In the examples illustrated in FIGS. 3A and 3B, the distance holding elements 30 as well as the pins 32, 34 are illustrated having a round cross-section. This, however, is only an example. Any other cross-section is possible. For example, the distance holding element 30 as well as the pins 32, 34 may have a square, a rectangular, an oval, or any other rounded or polygonal cross-section. The pins 32, 34 may have the same or a different cross-section as the distance holding element 30. For example, the distance holding element 30 may have a rectangular cross-section, while the pins 32, 43 have a rounded cross-section. Any other combinations of cross-sections are possible.

As is illustrated in FIGS. 1A-1B and 2, the base plates 12 may have a square cross-section. A counterpart 22 may be arranged in each of the corners of the base plate 12, for example. Accordingly, one spacer element 14 may be arranged in each of the corners of the base plates 12. This, however, is only an example. In some cases, less than four spacer element 14 and counterparts 22 are required between two neighboring base plates 12. It is also possible to provide more than four counterparts 22 and more than four spacer elements 14 between two neighboring base plates 12. The counterparts may be provided on both sides (e.g., top and bottom side) of the base plates 12, such that a neighboring base plate 12 may be arranged towards both sides. The counterparts 22 may be separate for both sides of the base plates 12. It is, however, also possible that each counterpart 22 is a continuous hole that extends from one side (e.g. top side) of the base plate 12 to the other side (e.g., bottom side). A top side of the base plates 12 may be a side on which at least one semiconductor substrate is or may be mounted. A bottom side of a base plate 12 may be a side opposite to the first side that is or may be mounted to a heat sink, for example.

Figure 4:
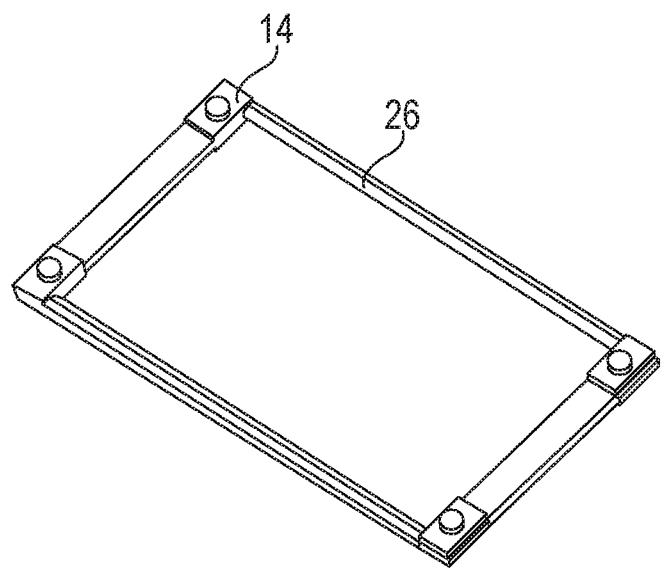
FIG. 4 schematically illustrates a three-dimensional view of exemplary spacer elements according to another example.
Figure 5:
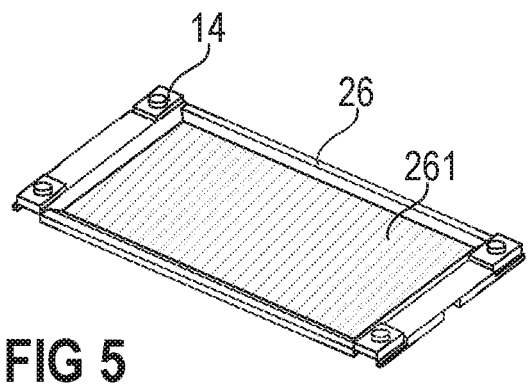
FIG. 5 schematically illustrates a three-dimensional view of exemplary spacer elements according to another example.

As is schematically illustrated in FIG. 4, two or more spacer element 14 may be coupled to each other by means of a frame 26, for example. According to one example, one spacer element 14 is arranged in each of the corners of a rectangular frame 26. The frame 26 in the example of FIG. 4 is an empty frame 26. This, however, is only an example. As is schematically illustrated in FIG. 5, the frame 26 may surround a thin plate 261. In other words, a thin plate 261 may fill the area that is spanned or surrounded by the frame 26. However, the thin plate 261 may be set back as compared to the frame 26. That is, a thickness of the thin plate 261 may be less than a thickness of the frame 261 in a direction perpendicular to the base plate 12, when the base plate 12 is arranged adjacent the spacer elements 14 and the frame 26. In this way, when the frame 26 is arranged such that the pins 32, 34 of the spacer elements 14 engage with the corresponding counterparts 22 of two neighboring base plates 12, the thin plate 261 does not touch or contact the base plates 12. The frame 26 again may be thinner than the spacer elements 14 in the direction perpendicular to the base plates 12 when the base plate 12 is arranged adjacent the spacer elements 14 and the frame 26. In this way, the frame 26 is prevented from touching the base plates 12. Only the spacer elements 14 directly contact the base plates 12. In this way, abrasion of the base plate 12 may be reduced. Further, the spacer elements 14 may be arranged in insignificant (edge) regions of the base plates 12. The central region of the base plates 12 which is usually an active region with one or more elements mounted thereon is kept free and does not contact any of the neighboring base plates 12, the frame 26, or the spacer elements 14.

Figure 6A:
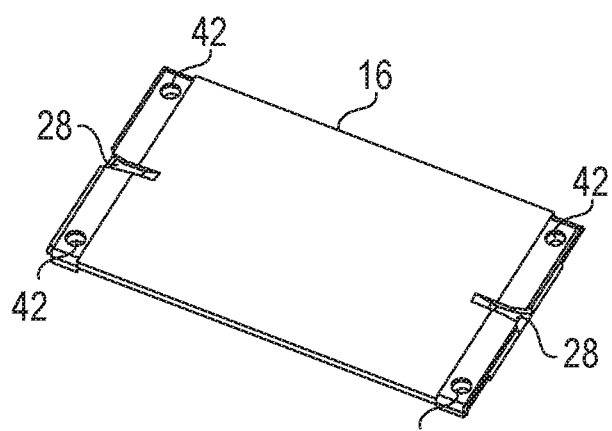
FIGS. 6A and 6B schematically illustrate respective three-dimensional views of exemplary stack termination elements.
Figure 6B:
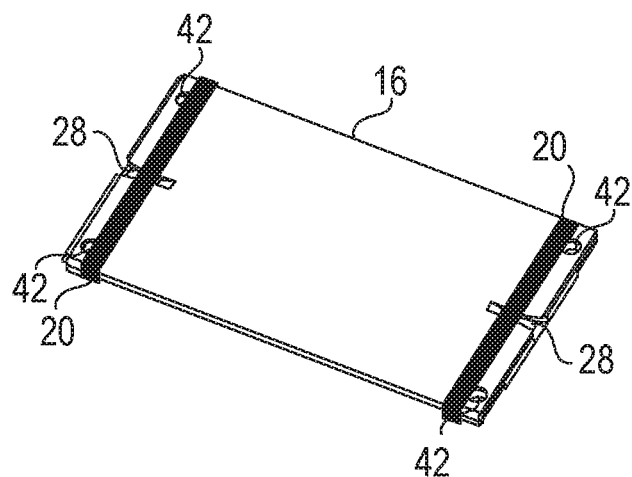

Now referring to FIG. 6A, a stack termination element 16 according to one example is schematically illustrated. A stack 10 of base plates 12 may comprise two stack termination elements 16 in order to protect the exposed surfaces of the two outermost base plates 12 of the stack 10. A stack termination element 16 may comprise a plate having essentially the same size and cross-section as the base plates 12. In this way, when arranged on a stack 10, the stack termination elements 16 completely covers the respective base plates 12 towards the sides of the stack 10. As is exemplarily illustrated in FIG. 6A, the stack termination elements 16 may comprise at least one groove or slot 28. The groove or slot 28 makes it easier to cut the at least one retaining element 20 when unpacking the base plates 12 for assembly. This is exemplarily illustrated for a stack termination element 16 in FIG. 6B. In the example of FIG. 63, the illustrated stack termination element 16 comprises two grooves or slots 28. Each of the at least one groove or slot 28 may be arranged along one of the narrow sides of a rectangular stack termination element 16. Each of the at least one retaining elements 20 may at least partly cover one of the grooves or slots 28. When using, e.g., a knife, to cut the retaining elements 20, the knife may be inserted into the corresponding groove or slot 28 to easily cut the retaining element 20. For the sake of simplicity, the remaining elements of the stack (base plates 12 and spacer elements 14) are not illustrated in FIG. 6B.

According to one example, the stack termination elements 16 comprise a recess (not specifically illustrated). A label, sticker or any other identification mark may be arranged in such a recess. For example, a registration number or barcode may be printed on a label or sticker that is arranged in such a recess in order to be able to clearly identify the stack 10 of base plates 12.

On a first side (e.g., top side which faces to the outside when arranged on a stack 10), the stack termination element 16 may comprise indentations 42. Such indentations 42, however, are optional. A stack termination element 16 may be arranged on a surface before forming the stack 10 on top of the stack termination element 16. The surface (not illustrated) may comprise pins. The stack termination element 16 may be arranged on the surface such that the pins of the surface engage with the indentations 42 of the stack termination element 16, In this way, the stack termination element 16 may be prevented from shifting unintentionally on the surface while forming the stack 10. On a second side (e.g., bottom side which faces the base plates 12 when arranged on a stack, bottom side not specifically illustrated in FIG. 4), the stack termination element 16 may either comprise pins or indentations. If the stack termination element 16 comprises pins, such pins may engage with corresponding counterparts 22 of a neighboring base plate 12 to prevent the base plate 12 from shifting unintentionally on the stack termination element 16 while forming the stack 10. If the stack termination element 16 comprises indentations 42 on its second side, the indentations 42 may be similar to the counterparts 22 of the base plates 12, and spacer elements 14 may be arranged between the stack termination element 16 and the neighboring base plate 12 to prevent the base plates 12 and the stack termination element 16 from shifting with respect to each other.

As has been described above, the size and shape of the counterparts 22 may correspond to the size and shape of the pins 32, 34 of the spacer elements 14. In this way, the pins 32, 34 may be firmly inserted into the counterparts 22. The pins 32, 34 may be removed from the counterparts 22 by pulling them out with a certain amount of force, for example. However, according to some examples, no force may be necessary at all to remove the pins 32, 34 from the counterparts. According to another example, the pins 32, 34 comprise threads and the counterparts 22 comprise threaded holes. The pins 32, 34 in this example may be screwed into the corresponding counterparts 22. According to an even further example, the first pin 32 of each spacer element 14 comprises a thread, and the second pin 34 of each spacer element 14 comprises a threaded hole. The counterparts 22 may comprise holes extending through the base plates 12. The first pin 32 of a first spacer element 14 may be inserted into a counterpart 22 from a first side, and the second pin 34 of a second spacer element 14 may be inserted into the same counterpart 22 from an opposite side. The first pin 32 of the first spacer element 14 may then be screwed into the second pin 34 of the second spacer element 14. This prevents the pins 32, 34 of the spacer elements 14 from unintentionally sliding out of the counterparts 22. In this case, retaining elements 20 may be omitted, as it may not be necessary to further secure the stack 10. Indentations 42 of the stack termination elements 16 may also comprise threaded holes, similar to the counterparts 22 of the base plates 12.

Figure 7:
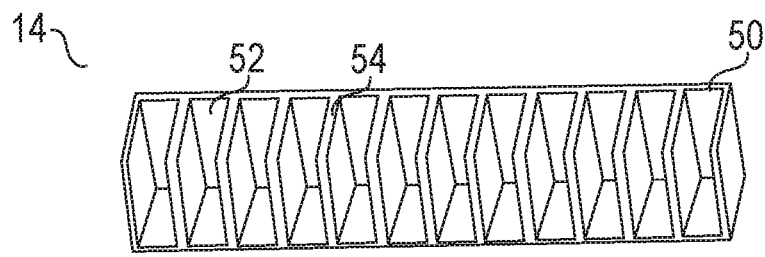
FIG. 7 schematically illustrates a three-dimensional view of a spacer element according to another example.

Spacer elements 14 according to any of FIGS. 1A-1B, 3A-3B, 4 and 5, however, are only an example. According to another, alternative example which is schematically illustrated in FIG. 7, a spacer element 14 may comprise an edge element 50. The edge element 50 may have an elongated form. The edge element 50 may comprise a plurality of compartments 52 along its length. One base plate 12 may be inserted in each of the compartments 52. In particular, one of the corners of a rectangular base plate 12 may be inserted in each of the compartments 52. A plurality of partition walls 54 separates the plurality of different compartments 52. That is, when a plurality of base plates 12 is inserted into the compartments 52, each base plate 12 is separated from its neighboring base plates 12 by one of the partition walls 54. A stack 10 of base plates 12, as is exemplarily illustrated in FIG. 8, may comprise at least two edge elements 50. Two edge elements 50 may be arranged in transversely opposite corners of the base plates 12 (illustrated in solid lines in FIG. 8). However, alternatively it is also possible that the stack 10 of base plates 12 comprises three or four edge elements 50 (third and fourth edge elements 50 illustrated in dashed lines in FIG. 8). The more edge elements 50 are used within a stack 10, the less is the risk of any corners of the base plates 12 being bent or broken unintentionally.

Now referring to FIGS. 9A through 9D, a method for preparing semiconductor module base plates 12 for transportation is exemplarily illustrated. In a First step (see FIG. 94), a stack termination element 16 may be provided. The stack termination element 16 may form a lowermost layer of a stack 10. A base plate 12 may be arranged on the stack termination element 16 (see FIG. 9B). When arranging the base plate 12 on the stack termination element 16, optionally two or more spacer elements 14 may be arranged between the stack termination element 16 and the base plate 12. The optional spacer elements 14 may engage with a corresponding counterpart 22 of the base plate 12 and with a corresponding (optional) indentation 42 of the stack termination element 16. Further spacer elements 14 may be arranged on the base plate 12, followed by a further base plate 12, and so on. In this way a stack 10 may be formed which comprises a plurality of base plates 12 and a plurality of spacer elements 14, with layers of base plates 12 and layers of spacer elements 14 arranged alternatingly within the stack 10 (see FIG. 9C). A topmost layer of the stack 10 may be formed by a further stack termination element 16. After forming the stack 10, the stack 10 optionally may be bound together with at least one retaining element 20 (see FIG. 9D).

Figure 8:
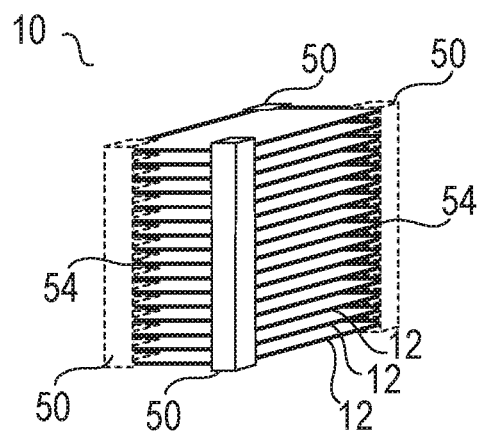
FIG. 8 schematically illustrates a stack of base plates including spacer elements according to the example of FIG. 7.

Alternatively, when using edge elements 50 according to the alternative example of FIG. 8, a plurality of base plates 12 may be inserted into the compartments 52 of one edge element 50. Once all of the compartments 52 are filled with base plates 12, at least one second edge element 50 may be arranged on a transversely opposite corner of the base plates 12 such that each of the compartments 52 of the second edge element is filled with a corner of a base plate 12. Optionally, in the same step or during a following step a third and further optionally a fourth edge element 50 may be arranged at the remaining corners of the base plates 12. The stack 10 may be bound together by means of retaining elements 20. Each retaining element 20 may at least partly cover two or more of the edge elements 50 in order to prevent the base plates 12 from falling out of the edge elements 50.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:

1. A transportation system for semiconductor module base plates, comprising:
   a plurality of spacer elements, each of the plurality of spacer elements comprising a distance holding element, a first pin on a first side of the distance holding element, and a second pin on a second side of the distance holding element,
   wherein each of the plurality of spacer elements is configured to be arranged between two of a plurality of semiconductor module base plates,
   wherein each of the first pin and second pin is configured to engage with a corresponding counterpart of one of the semiconductor module base plates when the corresponding spacer element is arranged between two of the semiconductor module base plates.

2. The transportation system of claim 1, wherein each of the plurality of spacer elements, when arranged between and engaged to two of the semiconductor module base plates, defines a distance between the two respective ones of the semiconductor module base plates.

3. The transportation system of claim 1, wherein a dimension of the distance holding element corresponds to a distance between a first semiconductor module base plate and a second neighboring base plate of the plurality of semiconductor module base plates when the spacer element is arranged between the first semiconductor module base plate and the second neighboring base plate.

4. The transportation system of claim 1, wherein two or more of the spacer elements are interconnected by a frame.

5. The transportation system of claim 4, wherein a thickness of the frame in a first direction is less than the length of the distance holding element of the corresponding spacer elements in the same direction such that the frame is not in direct contact with the semiconductor module base plates when the spacer elements are engaged with the semiconductor module base plates, and wherein the first direction is perpendicular to a main surface of the semiconductor module base plates when the spacer elements are engaged with the semiconductor module base plates.

6. The transportation system of claim 5, further comprising a thin plate filling the area that is spanned or surrounded by the frame, wherein a thickness of the thin plate in the first direction is less than the thickness of the frame in the same direction such that the thin plate is not in direct contact with the semiconductor module base plates when the spacer elements are engaged with the semiconductor module base plates.

7. The transportation system of claim 1, wherein each of the plurality of spacer elements comprises at least one of a plastic material and a metallic material.

8. The transportation system of claim 1, wherein each of the spacer elements has a round cross-section, a square cross-section, a rectangular cross-section, an oval cross-section, or a polygonal cross-section.

9. The transportation system of claim 1, wherein a cross section of the first pin and the second pin corresponds to a cross section of the distance holding element.

10. The transportation system of claim 1, wherein a cross section of the first pin and the second pin differs from a cross section of the distance holding element.

11. The transportation system of claim 1, further comprising:
   a first stack termination element configured to form a topmost layer of a stack formed of the plurality of semiconductor module base plates and the plurality of spacer elements; and
   a second stack termination element configured to form a lowermost layer of the stack.

12. The transportation system of claim 11, wherein each of the first stack termination element and the second stack termination element comprises a plate having the same size and cross-section as the semiconductor module base plates.

13. The transportation system of claim 11, wherein each stack termination element further comprises at least one groove or slot.

14. The transportation system of claim 13, wherein each stack termination element has a rectangular shape, and wherein each of the at least one groove or slot is arranged along a narrow side of the corresponding stack termination element.

15. A method, comprising:
   forming a stack by stacking a plurality of semiconductor module base plates and a plurality of spacer elements on top of each other, the semiconductor module base plates and the spacer elements forming a plurality of layers that are stacked alternatingly within the stack, each of the plurality of semiconductor module base plates comprising a plurality of counterparts, each of the spacer elements comprising a distance holding element, a first pin on a first side of the distance holding element, and a second pin on a second side of the distance holding element; and
   inserting each first pin of the plurality of spacer elements into one of the counterparts of a first one of the semiconductor module base plates, and inserting the second pin of the respective spacer element into one of the counterparts of a neighboring one of the semiconductor module base plates.

* * * * *